United States Patent
Cases et al.

(10) Patent No.: US 8,402,406 B2
(45) Date of Patent: Mar. 19, 2013

(54) CONTROLLING PLATING STUB REFLECTIONS IN A CHIP PACKAGE

(75) Inventors: Moises Cases, Austin, TX (US); Bhyrav M. Mutnury, Austin, TX (US); Nanju Na, Essex Junction, VT (US); Terence Rodrigues, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/979,745

(22) Filed: Dec. 28, 2010

(65) Prior Publication Data

US 2012/0167033 A1 Jun. 28, 2012

(51) Int. Cl.
*G06F 17/50* (2006.01)
*G06F 9/455* (2006.01)
*H01L 23/02* (2006.01)
*H01L 21/00* (2006.01)
*H01R 9/00* (2006.01)

(52) U.S. Cl. .................. 716/110; 257/678; 257/E23.06; 361/772; 438/121; 716/132

(58) Field of Classification Search .................. None
See application file for complete search history.

(56) References Cited

U.S. PATENT DOCUMENTS

| 6,812,803 | B2 * | 11/2004 | Goergen | 333/1 |
| 6,900,533 | B2 * | 5/2005 | Burton | 257/698 |
| 7,164,196 | B2 * | 1/2007 | Kawabata | 257/698 |
| 7,230,835 | B1 * | 6/2007 | Ahmad | 361/794 |
| 7,265,534 | B2 | 9/2007 | Majerus et al. | |
| 7,405,109 | B2 * | 7/2008 | Burton | 438/125 |
| 7,471,175 | B2 | 12/2008 | Voss | |
| 7,480,748 | B2 | 1/2009 | Sim et al. | |
| 7,521,781 | B2 | 4/2009 | Jin | |
| 7,615,478 | B2 | 11/2009 | Salmon | |
| 8,110,500 | B2 * | 2/2012 | Mutnury et al. | 438/667 |
| 2006/0199390 | A1 | 9/2006 | Dudnikov, Jr. et al. | |
| 2007/0273043 | A1 | 11/2007 | Pendse et al. | |
| 2008/0075070 | A1 * | 3/2008 | Goergen | 370/360 |

FOREIGN PATENT DOCUMENTS

| JP | 2001168236 A | 6/2001 |
| JP | 2005328032 A | 11/2005 |

OTHER PUBLICATIONS

Technical Disclosure "Mitigation of Effects of Differential Stubs in Wire-Bond Packages on Differential Return Loss for High Speed Serial Interfaces", IPCOM000193620D, publishod Mar. 5, 2010.

(Continued)

*Primary Examiner* — A. M. Thompson
(74) *Attorney, Agent, or Firm* — H. Barrett Spraggins; Thomas E. Tyson; Biggers & Ohanian, LLP

(57) ABSTRACT

Methods, apparatuses, and computer program products are disclosed for controlling plating stub reflections in a chip package. In one embodiment, a resonance optimizer determines performance characteristics of a bond wire that connects a chip to a substrate of a semiconductor chip mount. In this embodiment, the resonance optimizer selects, based on the performance characteristics of the bond wire, a line width for an open-ended plating stub that extends from a signal interconnect of the substrate to a periphery of the substrate, The resonance optimizer also generates a design of signal traces for the substrate, where the signal traces include the open-ended plating stub with the selected line width.

11 Claims, 7 Drawing Sheets

OTHER PUBLICATIONS

Technical Disclosure, "Novel Method and Apparatus for Minimizing Plating Stub Impact in Wire Bond Packages with High Resistance Coating" Authors et al,: IBM IP.com number: IPCOM000175662D Original Publication Date: Oct. 1, 2008 IP.com Electronic Publication: Oct. 17, 2008.

* cited by examiner

Loss behavior change at and near resonance with line width selection of open plating stub

US 8,402,406 B2

CONTROLLING PLATING STUB REFLECTIONS IN A CHIP PACKAGE

BACKGROUND OF THE INVENTION

1. Field of the Invention

The field of the invention is data processing, or, more specifically, methods, apparatus, and products for controlling plating stub reflections in a chip package.

2. Description of Related Art

An integrated circuit (IC), also commonly referred to as a "microchip" or "chip," is an electronic circuit comprising miniaturized semiconductor devices formed in a semiconductor substrate. Many copies of a chip may be formed on a large semiconductor wafer and then cut into individual chips, which may be interchangeably referred to in the art as a "die chips" or "dies". However, semiconductor materials such as silicon are typically brittle, and chips made this way are fragile. Therefore, an individual die chip is commonly packaged on a carrier, referred to as a "chip package" or simply "package." The housing of the chip package protects the chip and the package provides an electrical and mechanical interface between the chip and a printed circuit board (PCB) such as a computer motherboard.

Electrical connections between a die chip and the package substrate may be made by wirebonding. Wirebonding is a process known in the art by which a very fine wire is connected from a bond pad on the chip to corresponding signal pathways ("traces") on the package substrate. Bond wires are formed of a highly conductive metal such as copper, gold or aluminum. A package in which a die chip is connected to the substrate by wirebonding may be referred to as a "wirebond package." The traces on the substrate extend from the location of bonding with the wirebond to signal interconnects elsewhere on the substrate.

The signal interconnects on one layer of the substrate may be electrically connected to signal interconnects on another layer of the substrate using through-connections known as "vias." Thus, for example, the signal connects on the face to which the chip is mounted may be connected to corresponding pins of a pin grid array (PGA) or to corresponding balls of a ball grid array (BGA) on the opposing face of the substrate. The PGA or BGA may then be placed in contact with a corresponding pattern of electrical contacts on the PCB to which the chip package is subsequently secured.

Signal traces are typically formed of commonly available materials, such as copper, that are relatively affordable and have sufficient electrical conductivity. Materials having improved electrical conductivity, including precious metals such as platinum and gold, are then selectively applied to the substrate at locations where the expense of such materials is warranted. For example, to facilitate wire bonding, platinum may be applied at locations along the signal traces where wire bonds are formed. Gold is often applied to signal interconnects. These materials are usually applied by electroplating. However, most electroplating processes result in open plating stubs extending from the signal interconnects. The electroplating voltage is applied at or near the periphery of the package substrate, which results in the plating stubs extending to or near the periphery of the substrate. Plating stubs may hinder signal performance of the package if left intact. Signal performance is greatly impacted by reflections from the open stubs at the high operational frequencies of modern chips. A quarter-wave length resonance is particularly detrimental in high speed data transmissions.

SUMMARY OF THE INVENTION

Methods, apparatuses, and computer program products are disclosed for controlling plating stub reflections in a chip package. Embodiments include determining, by a resonance optimizer, performance characteristics of a bond wire, the bond wire connecting a chip to a substrate of a semiconductor chip mount; based on the performance characteristics of the bond wire, selecting, by the resonance optimizer, a line width for an open-ended plating stub, the open-ended plating stub extending from a signal interconnect of the substrate to a periphery of the substrate; and generating, by the resonance optimizer, a design of signal traces for the substrate, the signal traces including the open-ended plating stub with the selected line width.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
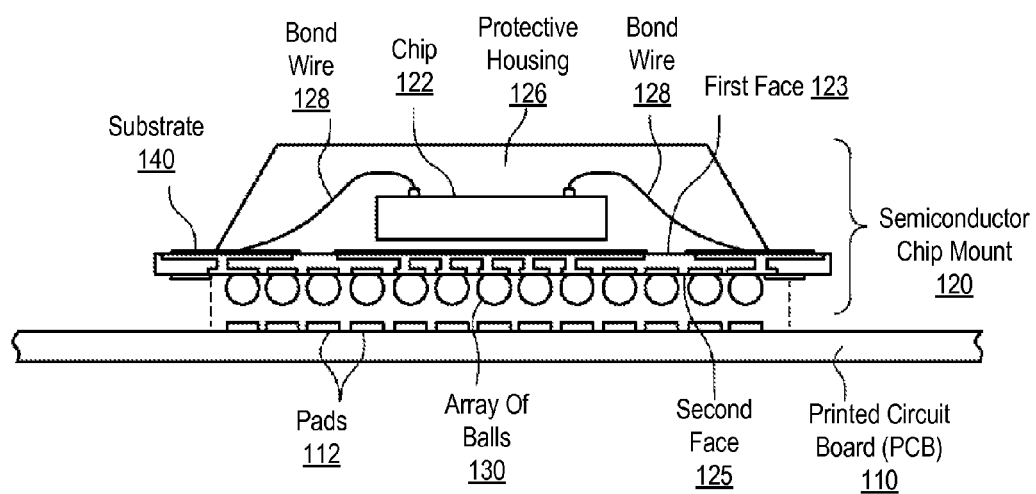
FIG. 1 sets forth a schematic side view of a surface-mount, semiconductor chip package configured for assembly to a surface of a printed circuit board (PCB) in accordance with an embodiment of the invention.

Examples of methods, apparatus, and computer program products for controlling plating stub reflections in a chip package in accordance with the present invention are described with reference to the accompanying drawings, beginning with FIG. FIG. 1 sets forth a schematic side view of a surface-mount, semiconductor chip package (120) configured for assembly to a surface of a printed circuit board (PCB) 110). The package substrate (140) only shows two layers for simplicity of illustration, but such a substrate usually has multiple layers. The package (120) includes a chip (122) mounted on a first face (123) of a package substrate (140). Although not required, the chip (122) may be enclosed in a protective housing (126), such as molded plastic encapsulating the chip (122). The chip (122) is electrically connected to a ball grid array (BGA) disposed on a second face (125) opposite the first face (123). In the orientation shown, the first face (123) may be referred to as the top face and the second face (125) may be referred to as the bottom face. The array of balls (130) are aligned for contact with a corresponding pattern of electrical contacts or pads (112) on the PCB (110). The balls (130) may be heated to melting or softening while in contact with the electrical pads (112) on the PCB (110), and then cooled to secure the BGA. As an alternative, pins or other electrical contacts may be provided on the substrate (140) in lieu of a ball grid array, with an appropriate choice of electrical contacts on the PCB (110) for mating with the pins or other electrical contacts on the substrate (140).

Figure 2:
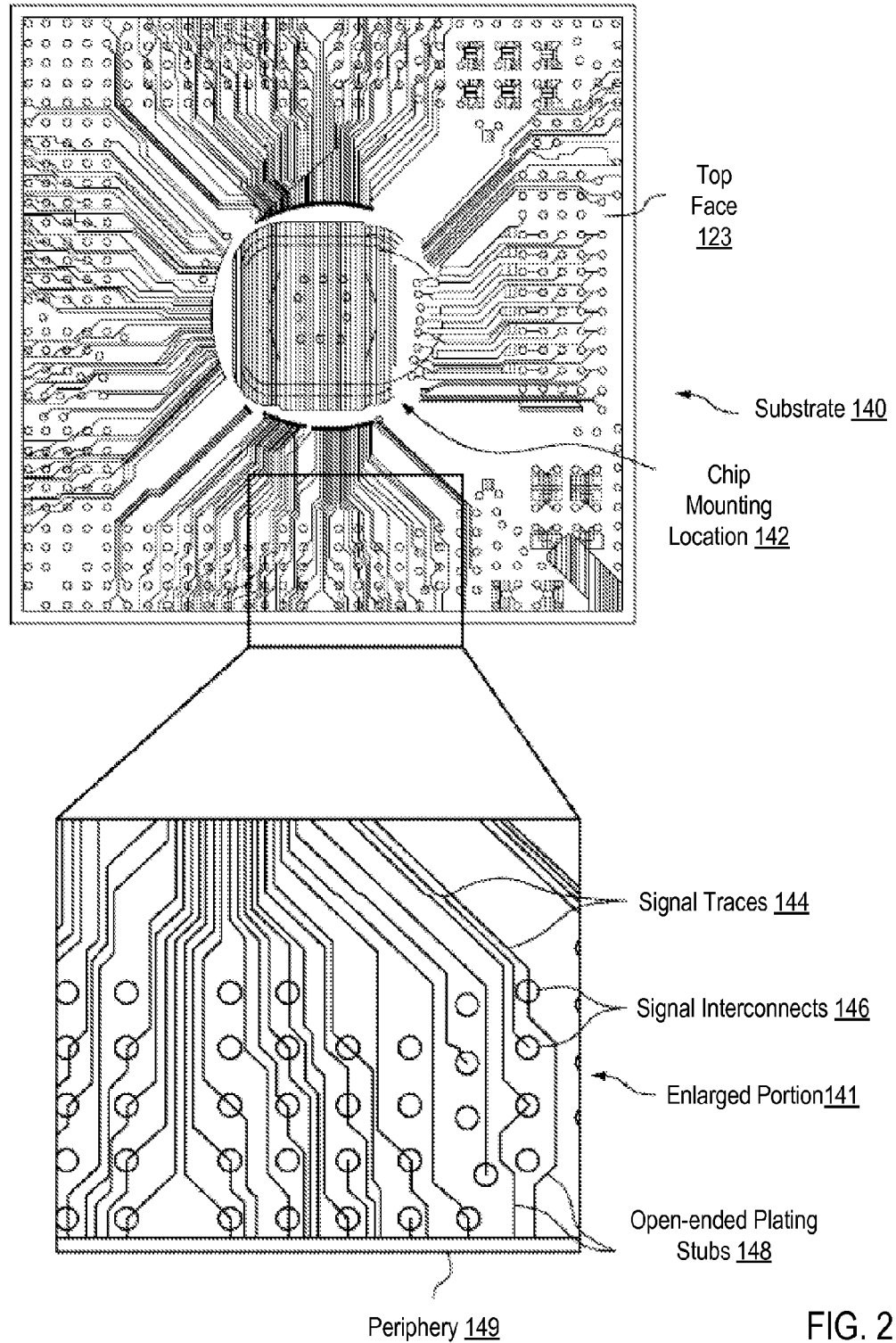
FIG. 2 sets forth a plan view of the package substrate without the chip, housing or bond wires.

FIG. 2 sets forth a plan view of the package substrate (140) without the chip (122), housing (126) or bond wires (128). The figure includes an enlarged view of a portion (141) of the substrate (140). The substrate (140) provides a centrally located chip mounting location (142) for receiving the chip (122) (see FIG. 1). A plurality of discrete electrical pathways, embodied here as signal traces (144), are formed on the substrate (140). The signal traces (144) may be formed according to known techniques in the art of circuit board manufacturing. The signal traces (144) may be formed, for example, by a subtractive process, in which a sheet of copper or other conductive material laminated to the substrate (140) is etched away to leave the desired pattern of traces. Less commonly, the signal traces (144) may be formed by an additive process, in which copper is plated onto the substrate (140) in the desired pattern such that no etching is required. A plurality of signal interconnects (146) (alternatively referred to as via pads) are shown position across the top face (123) of the substrate (140). The signal interconnects (146) are concentric with vias, which are through-holes extending through the substrate (140). Each signal trace (144) extends radially outwardly from the chip mounting location (142) to a corresponding one of the signal interconnects (146).

Features of the substrate (140) may be electroplated, such as the signal interconnects (146), the vias concentric with the signal interconnects (146), portions of the signal traces (144) and bond pads where bond wires are to be attached. As best shown in the enlarged portion (141), a plurality of open-ended plating stubs (148) extend outwardly from many of the signal interconnects (146) in a direction away from the chip mounting location (142) to a periphery (149) of the substrate (140). The plating stubs for other signal interconnects not shown in FIG. 2 are routed on the opposite side of the substrate (140) from BGA pads to the periphery (149). The signal traces (144) and the plating stubs (148) extend radially outwardly from the centrally located chip mounting location (142), although it is not necessary for the signal traces (144) or plating stubs (148) to be straight or lie exactly on radii extending from a common center.

The plating stubs (148) are open ended by virtue of extending past the respective signal interconnects (146) without connecting to another device or conductive pathway. Typically, the open plating stubs (148) extend all the way from one of the signal interconnects (146) to or near the periphery (149) of the substrate (140), because to perform gold plating for bond pads past signal interconnects (146) on the substrate (140), the pathway to bond pads as electrodes must be rendered conductive from the outer edge of the interposer. However, the invention may be embodied even on a substrate wherein the plating stubs do not extend fully to a periphery (149). For example, any present or future-developed electroplating process that results in an open plating stub extending radially outward from a signal interconnect may benefit from an embodiment of the invention, regardless of whether the plating stub extends completely to the periphery of a package substrate.

Figure 3:
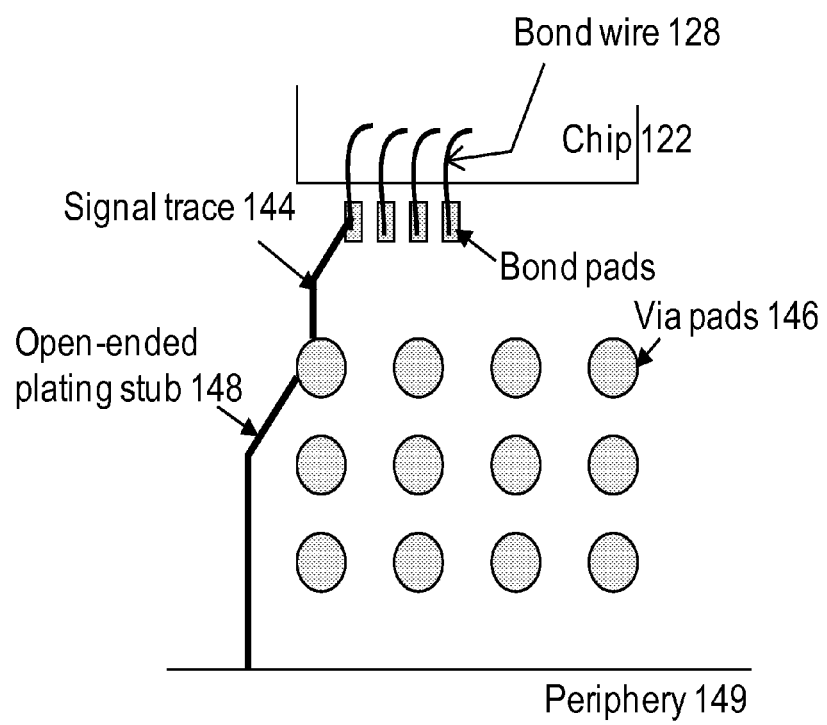
FIG. 3 sets forth a schematic plan view of the package substrate wherein the selecting of the line width of the open-ended plating stub alters reflection behavior caused by the presence of the open-ended plating stub near and at the resonance frequency affecting signal pass-band.

FIG. 3 sets forth a schematic plan view of the package substrate (140) wherein the selecting of the line width of the open-ended plating stub (148) alters reflection behavior caused by the presence of the open-ended plating stub (148) near and at the resonance frequency affecting signal passband. A bond wire (128) electrically couples the signal trace (146) extending from a particular signal interconnect (146) to the chip (122). The open-ended plating stub (148) extends outwardly from the signal interconnect (146) to the periphery (149) of the substrate (140).

Figure 4:
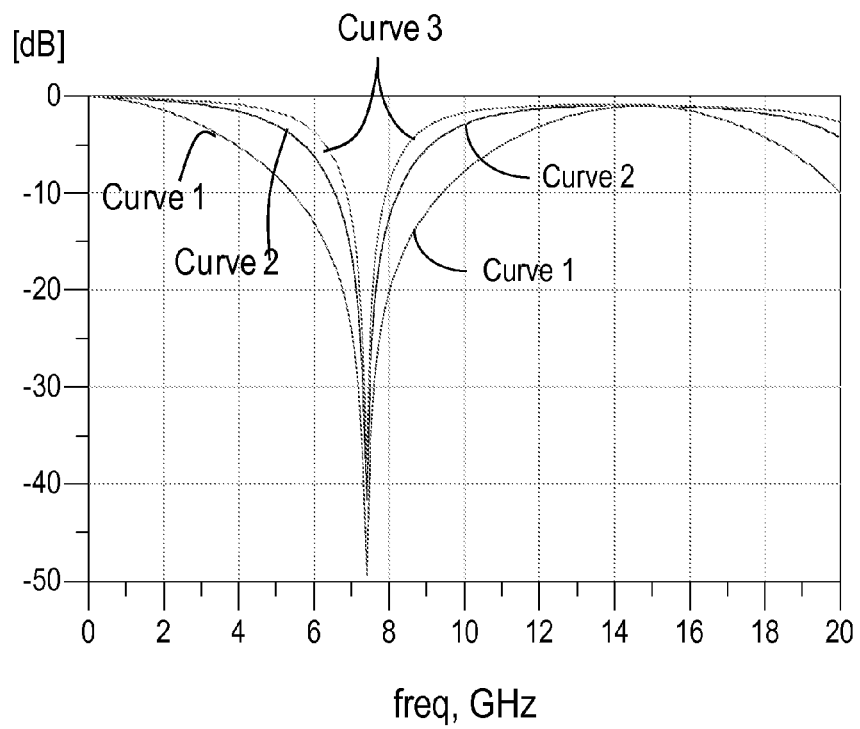
FIG. 4 sets forth a graph illustrating the frequency behavior change of signal loss caused by selecting a line width of the open-ended plating stub based on the performance characteristics of the signal trace.

FIG. 4 sets forth a graph illustrating the altered loss behavior near the resonance frequency caused by selecting a line width of the open-ended plating stub (148) based on the performance characteristics of the signal trace (144). Curve 1 illustrates the signal performance for signals communicated along the signal trace (144) in a particular design of FIG. 3, assuming the plating stub (148) has a stub length of 7 mm. The local maxima (peak) of Curve 1 indicates a resonant frequency occurring at about 7 GHz caused by the presence of the open-ended plating stub (148), which imposes substantial signal interference, and is detrimental to high-speed signal transmission along the signal trace (144) with abrupt loss at frequencies far below 7 GHz. Curve 2 and Curve 3 illustrate the signal performance for signals communicated along the signal trace (144) in FIG. 3, after selecting a new line width of the open-ended plating stub (148). The resonance behavior is altered and loss improvements are seen with the widening operable frequency bandwidth as a result of the new line width of the open-ended plating stub (148).

Controlling plating stub reflections in a chip package in accordance with the present invention is generally implemented with computers, that is, with automated computing machinery. For further explanation, therefore, FIG. 5 sets forth a functional block diagram of an exemplary system for controlling plating stub reflections in a chip package according to embodiments of the present invention.

Figure 5:
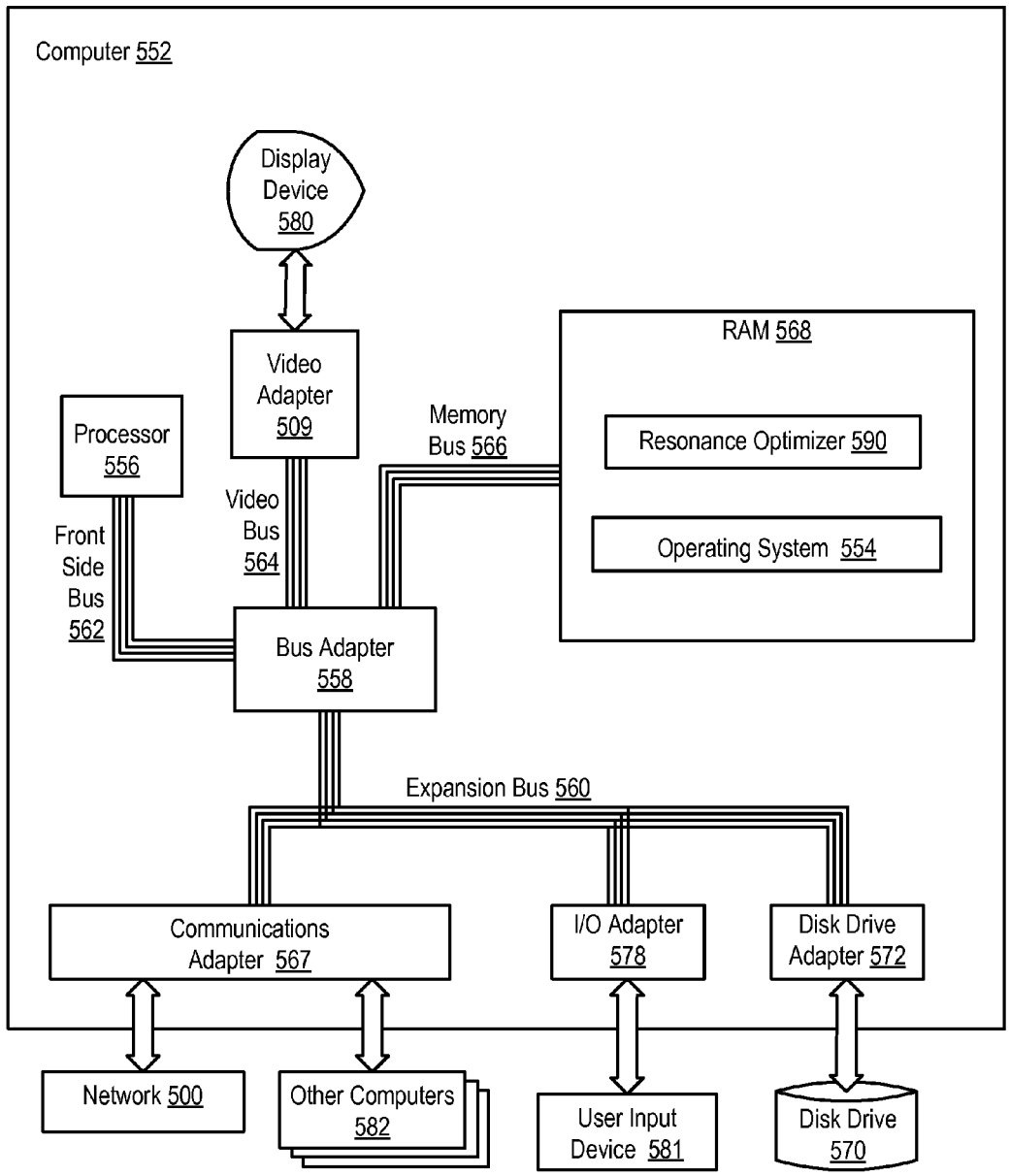
FIG. 5 sets forth a functional block diagram of an exemplary system for controlling plating stub reflections in a chip package according to embodiments of the present invention.

The system of FIG. 5 includes a computer (552) connected for data communications to other computers (536) through a wide area network (500). The computer (552) of FIG. 5 includes at least one computer processor (556) or 'CPU' as well as random access memory (568) ('RAM') which is connected through a high speed memory bus (566) and bus adapter (558) to processor (556) and to other components of the computer (552). Stored in RAM (568) is a resonance optimizer (590). The resonance optimizer (590) of FIG. 5 includes computer program instructions that when executed by the computer processor (556) cause the computer processor (556) to determine performance characteristics of a bond wire, the bond wire connecting a chip to a substrate of a semiconductor chip mount; based on the performance characteristics of the bond wire, select a line width of an open-ended plating stub, the open-ended plating stub extending from a signal interconnect of the substrate to a periphery of the substrate; and generate a design of signal traces for the substrate, the signal traces including the open-ended plating stub with the selected line width.

Also stored in RAM (568) is an operating system (554). Operating systems useful in computer system capable of identifying an optimized test bit pattern for analyzing electrical communications channel topologies according to embodiments of the present invention include UNIX™, Linux™, Microsoft XP™, Microsoft Vista™, AIX™, IBM's i5/OS™, and others as will occur to those of skill in the art. The operating system (554) and the resonance optimizer (590), in the example of FIG. 5, are shown in RAM (568), but many components of such software typically are stored in non-volatile memory also, such as, for example, on a disk drive (570).

The computer (552) of FIG. 5 also includes disk drive adapter (572) coupled through expansion bus (560) and bus adapter (558) to processor (556) and other components of the computer (552). Disk drive adapter (572) connects non-volatile data storage to the computer (552) in the form of disk drive (570). Disk drive adapters useful in computers that identifying an optimized test bit pattern for analyzing electrical communications channel topologies according to embodiments of the present invention include Integrated Drive Electronics ('IDE') adapters, Small Computer System Interface ('SCSI') adapters, and others as will occur to those of skill in the art. Non-volatile computer memory also may be implemented as an optical disk drive, electrically erasable programmable read-only memory (so-called 'EEPROM' or 'Flash' memory) (534), RAM drives, and so on, as will occur to those of skill in the art.

The example computer (552) of FIG. 5 includes one or more input/output ('I/O') adapters (578). I/O adapters implement user-oriented input/output through, for example, software drivers and computer hardware for controlling output to display devices such as computer display screens, as well as user input from user input devices (581) such as keyboards and mice. The example computer (552) of FIG. 5 includes a video adapter (509), which is an example of an I/O adapter specially designed for graphic output to a display device (580) such as a display screen or computer monitor. Video adapter (509) is connected to processor (556) through a high speed video bus (564), bus adapter (558), and the front side bus (562), which is also a high speed bus.

The exemplary computer (552) of FIG. 5 includes a communications adapter (567) for data communications with a data communications network (500) and other computers, such as the server (502), personal digital assistant ('PDA') (504), mobile phone (506), laptop (508), workstation (510), personal computer (512). Such data communications may be carried out serially through RS-232 connections, through external buses such as a Universal Serial Bus ('USB'), through data communications data communications networks such as IP data communications networks, and in other ways as will occur to those of skill in the art. Communications adapters implement the hardware level of data communications through which one computer sends data communications to another computer, directly or through a data communications network. Examples of communications adapters useful for identifying an optimized test bit pattern for analyzing electrical communications channel topologies according to embodiments of the present invention include modems for wired dial-up communications, Ethernet (IEEE 802.3) adapters for wired data communications network communications, and 802.11 adapters for wireless data communications network communications.

The arrangement of servers, computers, networks, and other devices making up the exemplary system illustrated in FIG. 5 are for explanation, not for limitation. Data processing systems useful according to various embodiments of the present invention may include additional servers, routers, other devices, and peer-to-peer architectures, not shown in FIG. 5, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 5.

Figure 6:
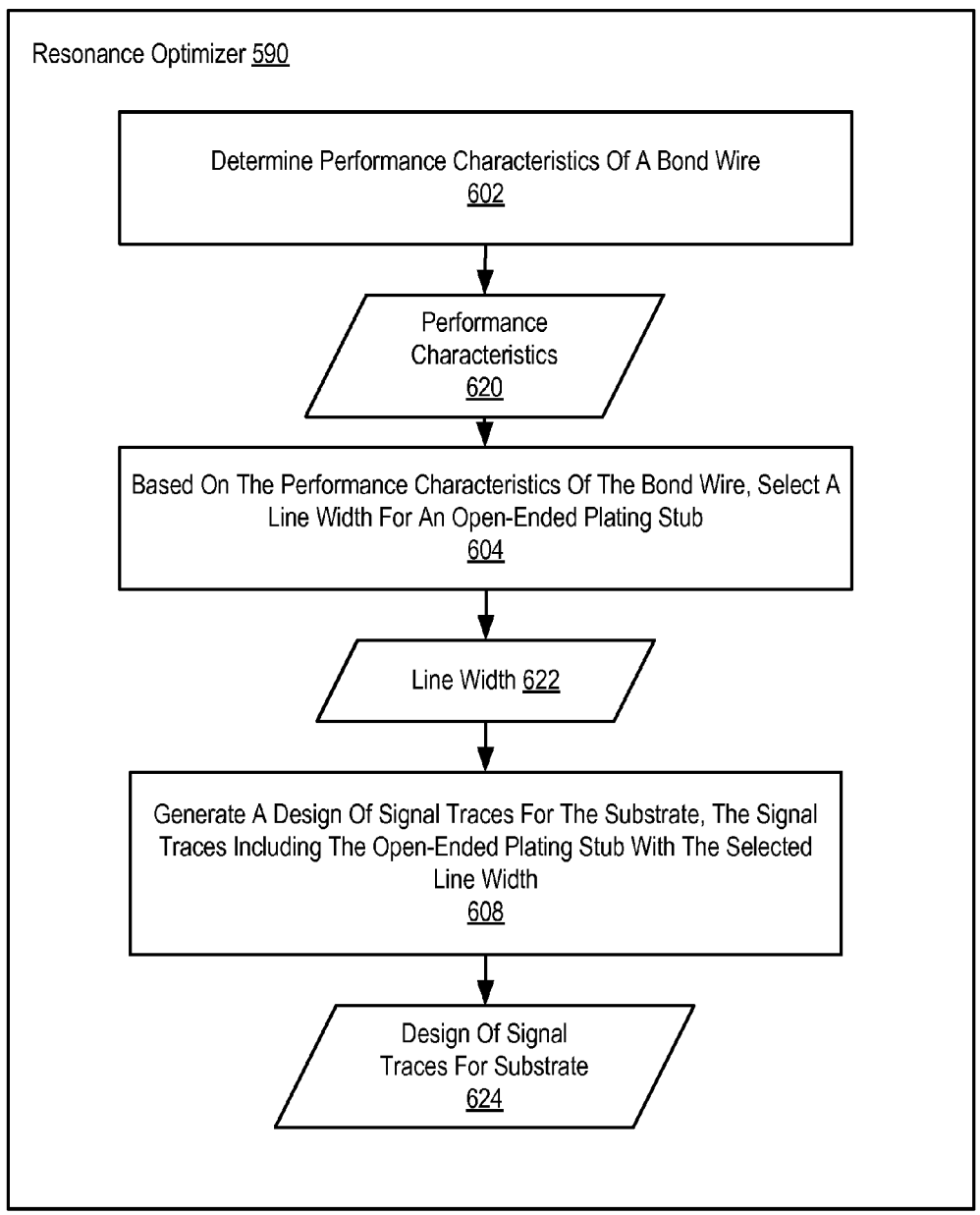
FIG. 6 sets forth a flow chart illustrating an example of a method for controlling plating stub reflections in a chip package according to embodiments of the present invention.

For further explanation, FIG. 6 sets forth a flow chart illustrating an example of a method for controlling plating stub reflections in a chip package according to embodiments of the present invention. The method FIG. 6 includes determining (602), by a resonance optimizer (590), performance characteristics (620) of a bond wire (128), the bond wire (128) connecting a chip (122) to a substrate (140) of a semiconductor chip mount (120). Determining (602) performance characteristics (620) of a bond wire (128) may be carried out by calculating the impedance of the bond wire (128).

The method of FIG. 6 includes based on the performance characteristics (620) of the bond wire (128), selecting (604), by the resonance optimizer (590), a line width (622) for an open-ended plating stub (148), the open-ended plating stub (148) extending from a signal interconnect (146) of the substrate (140) to a periphery (149) of the substrate (140). Selecting (604) a line width (622) for an open-ended plating stub (148) may be carried out by incrementally selected line widths, testing the line widths, and storing a line width that generates a particular result, such as a desired resonance frequency.

The method of FIG. 6 also includes generating (608), by the resonance optimizer (590), a design (624) of signal traces (144) for the substrate (140), the signal traces (144) including the open-ended plating stub (148) with the selected line width (622). Generating (608) a design (624) of signal traces (144) for the substrate (140) may be carried out by generating a gerber file. Gerber File is a file format used by printed circuit board (PCB) manufacturing machines to lay out electrical connections such as traces, vias, and pads (the component "footprints" on the PCB). A Gerber file can also contain information for drilling and milling the circuit board. These files may be generated by PCB CAD software, and may be sent to manufacturers where the gerber files are loaded into a CAM system to prepare data for each step of the PCB production process.

Figure 7:
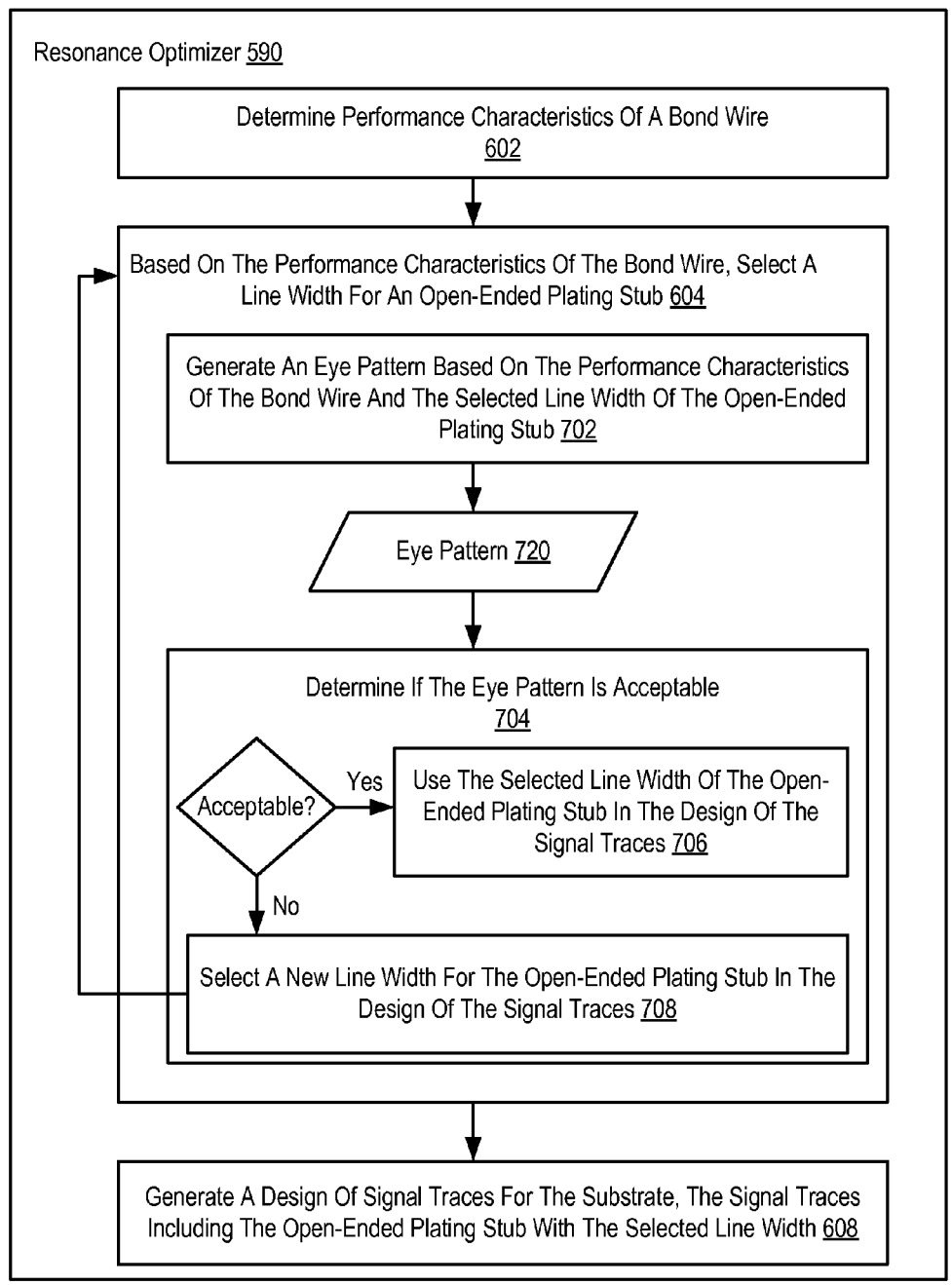
FIG. 7 sets forth a flow chart illustrating another example of a method for controlling plating stub reflections in a chip package according to embodiments of the present invention.

For further explanation, FIG. 7 sets forth a flow chart illustrating another example of a method for controlling plating stub reflections in a chip package according to embodiments of the present invention. The method of FIG. 7 includes the following elements of FIG. 6: determining (602), by a resonance optimizer (590), performance characteristics (620) of a bond wire (128); based on the performance characteristics (620) of the bond wire (128), selecting (604), by the resonance optimizer (590), a line width (622) for an open-ended plating stub (148); and generating (608), by the resonance optimizer (590), a design (624) of signal traces (144) for the substrate (140).

In the example of FIG. 7, however, selecting (604) a line width (622) for an open-ended plating stub (148) includes generating (702), by the resonance optimizer (590), an eye pattern (720) based on the performance characteristics (620) of the bond wire (128) and the selected line width (622) of the open-ended plating stub (148). Generating (702) an eye pattern (720) based on the performance characteristics (620) of the bond wire (128) and the selected line width (622) of the open-ended plating stub (148) may be carried out by measuring, at a receiver connected to a transmitter through an electrical communications channel, the value of a transmitted test bit pattern and superimposing the measured values of two or more clock cycles of the test bit pattern. An eye pattern is so called because, for several types of coding, the pattern looks like one or more eyes between a pair of rails. The opening of the eye has a vertical height and a horizontal width which may be used to derive a number of communication channel performance measurements.

In the example of FIG. 7, selecting (604) a line width (622) for an open-ended plating stub (148) includes determining (704), by the resonance optimizer (590), if the eye pattern (720) is acceptable. Determining (704) if the eye pattern (720) is acceptable may be carried out by determining the vertical height of the eye opening in the eye pattern (720). Generally, an open eye pattern corresponds to minimal signal distortion along the communications channel, and a closure of an eye pattern corresponds to intersymbol interference and noise in the communications channel. Specifically, as vertical height of the eye opening decreases, the presence of additive noise in the signal increases and as the width of the eye opening decreases the presence of jitter in the signal increases.

In the example of FIG. 7, selecting (604) a line width (622) for an open-ended plating stub (148) includes if the eye pattern (720) is acceptable, using (706), by the resonance optimizer (590), the selected line width (622) of the open-ended plating stub (148) in the design (624) of the signal traces (144). Using (706) the selected line width (622) of the open-ended plating stub (148) in the design (624) of the signal traces (144) may be carried out by storing the selected line width (622) and generating the design (624) using the selected line width (622).

In the example of FIG. 7, selecting (604) a line width (622) for an open-ended plating stub (148) includes if the eye pattern (720) is not acceptable, selecting (708), by the resonance optimizer (590), a new line width for the open-ended plating stub (148) in the design (624) of the signal traces (144). Selecting (708) a new line width for the open-ended plating stub (148) in the design (624) of the signal traces (144) may be carried out by incrementing the line width and repeating the selection (604) of the line width.

Exemplary embodiments of the present invention are described largely in the context of a fully functional computer system for controlling plating stub reflections in a chip package. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of controlling plating stub reflections in a chip package, the method comprising:
    determining, by a resonance optimizer, performance characteristics of a bond wire, the bond wire connecting a chip to a substrate of a semiconductor chip mount;
    based on the performance characteristics of the bond wire, selecting, by the resonance optimizer, a line width for an open-ended plating stub, the open-ended plating stub extending from a signal interconnect of the substrate to a periphery of the substrate, wherein selecting a line width of an open-ended plating stub based on the performance characteristics of the bond wire includes:
        generating, by the resonance optimizer, an eye pattern based on the performance characteristics of the bond wire and the selected line width of the open-ended plating stub;
        determining, by the resonance optimizer, if the eye pattern is acceptable;
        if the eye pattern is acceptable, using, by the resonance optimizer, the selected line width of the open-ended plating stub in the design of the signal traces; and
        if the eye pattern is not acceptable, selecting, by the resonance optimizer, a new line width for the open-ended plating stub in the design of the signal traces; and
    generating, by the resonance optimizer, a design of signal traces for the substrate, the signal traces including the open-ended plating stub with the selected line width.

2. The method of claim 1, wherein the performance characteristics of the bond wire includes an impedance of the bond wire.

3. The method of claim 1, wherein the selected line width of the open-ended plating stub is between one half and one fourth of a line width of the bond wire.

4. An apparatus for controlling plating stub reflections in a chip package, the apparatus comprising a computer processor and a computer memory operatively coupled to the computer processor, the computer memory having disposed within it computer program instructions, which when executed, cause the computer processor to perform steps of:
    determining, by a resonance optimizer, performance characteristics of a bond wire, the bond wire connecting a chip to a substrate of a semiconductor chip mount;
    based on the performance characteristics of the bond wire, selecting, by the resonance optimizer, a line width of an open-ended plating stub, the open-ended plating stub extending from a signal interconnect of the substrate to a periphery of the substrate, wherein selecting a line width of an open-ended plating stub based on the performance characteristics of the bond wire includes:
        generating, by the resonance optimizer, an eye pattern based on the performance characteristics of the bond wire and the selected line width of the open-ended plating stub;
        determining, by the resonance optimizer, if the eye pattern is acceptable;
        if the eye pattern is acceptable, using, by the resonance optimizer, the selected line width of the open-ended plating stub in the design of the signal traces; and
        if the eye pattern is not acceptable, selecting, by the resonance optimizer, a new line width for the open-ended plating stub in the design of the signal traces; and
    generating, by the resonance optimizer, a design of signal traces for the substrate, the signal traces including the open-ended plating stub with the selected line width.

5. The apparatus of claim 4, wherein the performance characteristics of the bond wire includes an impedance of the bond wire.

6. The apparatus of claim 4, wherein the selected line width of the open-ended plating stub is between one half and one fourth of a line width of the bond wire.

7. A computer readable storage medium for controlling plating stub reflections in a chip package, the computer readable storage medium comprising computer program instructions which, when executed, causes a computer to carry out the steps of:
    determining, by a resonance optimizer, performance characteristics of a bond wire, the bond wire connecting a chip to a substrate of a semiconductor chip mount;
    based on the performance characteristics of the bond wire, selecting, by the resonance optimizer, a line width of an open-ended plating stub, the open-ended plating stub extending from a signal interconnect of the substrate to a periphery of the substrate, wherein selecting a line width of an open-ended plating stub based on the performance characteristics of the bond wire includes:
        generating, by the resonance optimizer, an eye pattern based on the performance characteristics of the bond wire and the selected line width of the open-ended plating stub;

determining, by the resonance optimizer, if the eye pattern is acceptable;

if the eye pattern is acceptable, using, by the resonance optimizer, the selected line width of the open-ended plating stub in the design of the signal traces; and if the eye pattern is not acceptable, selecting, by the resonance optimizer, a new line width for the open-ended plating stub in the design of the signal traces; and generating, by the resonance optimizer, a design of signal traces for the substrate, the signal traces including the open-ended plating stub with the selected line width.

8. The computer readable storage medium of claim 7, wherein the performance characteristics of the bond wire includes an impedance of the bond wire.

9. The computer readable storage medium of claim 7, wherein the selected line width of the open-ended plating stub is between one half and one fourth of a line width of the bond wire.

10. A multi-layer substrate for controlling plating stub reflections in a chip package, comprising:

a first outer layer providing a chip mounting location, a signal interconnect spaced from the chip mounting location, a signal trace extending from near the chip mounting location to the signal interconnect, and an open-ended plating stub extending from the signal interconnect;

wherein the line width of the open-ended plating stub is determined by:

determining, by a resonance optimizer, performance characteristics of a bond wire, the bond wire connecting a chip to a substrate of a semiconductor chip mount;

based on the performance characteristics of the bond wire, selecting, by the resonance optimizer, a line width of an open-ended plating stub, the open-ended plating stub extending from a signal interconnect of the substrate to a periphery of the substrate, wherein selecting a line width of an open-ended plating stub based on the performance characteristics of the bond wire includes:

generating, by the resonance optimizer, an eye pattern based on the performance characteristics of the bond wire and the selected line width of the open-ended plating stub;

determining, by the resonance optimizer, if the eye pattern is acceptable;

if the eye pattern is acceptable, using, by the resonance optimizer, the selected line width of the open-ended plating stub in the design of the signal traces; and if the eye pattern is not acceptable, selecting, by the resonance optimizer, a new line width for the open-ended plating stub in the design of the signal traces; and generating, by the resonance optimizer, a design of signal traces for the substrate, the signal traces including the open-ended plating stub with the selected line width.

11. The multi-layer substrate of claim 10, wherein the selected line width of the open-ended plating stub is between one half and one fourth of a line width of the bond wire.

* * * * *